(12) United States Patent
Wang et al.

(10) Patent No.: US 9,218,964 B2
(45) Date of Patent: Dec. 22, 2015

(54) ANTIPHASE DOMAIN BOUNDARY-FREE III-V COMPOUND SEMICONDUCTOR MATERIAL ON SEMICONDUCTOR SUBSTRATE AND METHOD FOR MANUFACTURING THEREOF

(75) Inventors: Gang Wang, St. Peters, MO (US); Matty Caymax, Leuven (BE); Maarten Leys, Eindhoven (NL); Wei-e Wang, Overijse (BE); Niamh Waldron, Leuven (BE)

(73) Assignees: IMEC, Leuven (BE); Katholieke Universiteit Leuven, KU Leuven R&D, Leuven (BE)

( * ) Notice: Subject to any disclaimer, the term of this patent is extended or adjusted under 35 U.S.C. 154(b) by 840 days.

(21) Appl. No.: 13/198,959

(22) Filed: Aug. 5, 2011

(65) Prior Publication Data

US 2012/0032234 A1 Feb. 9, 2012

Related U.S. Application Data

(60) Provisional application No. 61/371,008, filed on Aug. 5, 2010.

(51) Int. Cl.
*H01L 21/20* (2006.01)
*H01L 29/267* (2006.01)
*H01L 21/02* (2006.01)

(52) U.S. Cl.
CPC ...... *H01L 21/02538* (2013.01); *H01L 21/0245* (2013.01); *H01L 21/0262* (2013.01); *H01L 21/02381* (2013.01); *H01L 21/02461* (2013.01); *H01L 21/02463* (2013.01); *H01L 21/02502* (2013.01); *H01L 21/02543* (2013.01); *H01L 21/02546* (2013.01); *H01L 21/02639* (2013.01)

(58) Field of Classification Search
USPC .............. 257/200, E21.09, E29.081; 438/493
See application file for complete search history.

(56) References Cited

U.S. PATENT DOCUMENTS

2007/0051299 A1* 3/2007 Ong et al. ........................ 117/43
2009/0032842 A1* 2/2009 Lagally et al. ................ 257/190
2011/0018030 A1 1/2011 Takada et al.

OTHER PUBLICATIONS

Extended European Search Report for 11176589.7-2203/2423951 dated Jul. 2, 2012.

(Continued)

*Primary Examiner* — Lynne Gurley
*Assistant Examiner* — Vernon P Webb
(74) *Attorney, Agent, or Firm* — McDonnell Boehnen Hulbert & Berghoff LLP

(57) ABSTRACT

Methods of manufacturing a III-V compound semiconductor material, and the semiconductor material thus manufactured, are disclosed. In one embodiment, the method comprises providing a substrate comprising a first semiconductor material having a {001} orientation and an insulating layer overlaying the first semiconductor material. The insulating layer comprises a recessed region exposing an exposed region of the first semiconductor material. The method further comprises forming a buffer layer overlaying the exposed region that comprises a group IV semiconductor material. The method further comprises thermally annealing the substrate and the buffer layer, thereby roughening the buffer layer to create a rounded, double-stepped surface having a step density and a step height. A product of the step density and the step height is greater than or equal to 0.05 on the surface. The method further comprises at least partially filling the recessed region with a III-V compound semiconductor material overlaying the surface.

19 Claims, 6 Drawing Sheets

(56) References Cited

OTHER PUBLICATIONS

Gang Wang et al., "Selective Epitaxial Growth of InP in STI Trenches on Off-Axis Si (001) Substrates", ECS Transactions, Electrochemical Society, US, vol. 27, No. 1, Mar. 18, 2010, pp. 959-964.

G. Wang et al., "Selective Area Growth of InP in ShallowTrench-Isolated Structures on Off-Axis Si (001) Substrates", Journal of the Electrochemical Society, vol. 157, No. 11, Sep. 21, 2010, pp. H1023-H1028.

Park Ji-Soo et al., "Facet Information and Lateral Overgrowth of Selective Ge Epitaxy on Si02-Patterned Si(001) Substrates", Journal of Vacuum Science and Technology: Part B, AVS / AIP, Melville, New York, NY, US, vol. 26, No. 1, 4 Jan. 2008, pp. 117-121.

Tang, Guang-Ping et al., "Antiphase-Domain-Free InP on (100) Si", Jpn. J. Appl. Phys. vol. 31 (1992), pp. L1126-L1128, Part 2, No. 8A, Aug. 1, 1992.

\* cited by examiner

ANTIPHASE DOMAIN BOUNDARY-FREE III-V COMPOUND SEMICONDUCTOR MATERIAL ON SEMICONDUCTOR SUBSTRATE AND METHOD FOR MANUFACTURING THEREOF

CROSS-REFERENCE TO RELATED APPLICATIONS

The present application is a non-provisional of U.S. Provisional Patent Application Ser. No. 61/371,008 filed Aug. 5, 2010, the contents of which are hereby incorporated by reference.

BACKGROUND

The present invention relates to an engineered substrate comprising a III-V compound semiconductor material thereon and a method for manufacturing such a III-V compound semiconductor material on a semiconductor substrate.

Development of high performance III-V complementary metal-oxide-semiconductor (CMOS) devices, a type of CMOS utilizing high mobility III-V materials (such as gallium arsenide or indium gallium arsenide as channels instead of silicon, has been suffering from the difficulties of epitaxially growing defect-free III-V materials on silicon substrates.

One difficulty of epitaxially growing III-V materials on silicon substrates is that there is a large lattice-mismatch between the lattice constants of III-V materials and the lattice constant of silicon. Another such difficulty is the formation of anti-phase domain boundaries (APB) which are actually defects that act as deep level nonradiative recombination centers and consequently deteriorate the electrical performance of the device significantly.

To avoid APB, silicon (001) or germanium (001) substrates with a miscut angle larger than 2 degrees (e.g., 6 degrees) may be used. However, using miscut substrates induces additional problems in the epitaxial growth of the III-V compound materials on patterned wafers, such as surface morphology and crystal quality dependence on orientation (non-isotropy), resulting in a significant barrier for their acceptance in CMOS device fabrication. In addition, the actual impact of the miscut on carrier transport is not clear.

Yet another drawback is that miscut silicon (001) substrates are not standard in silicon CMOS industry. Consequently, it is of great interest to grow APB free III-V materials on the largely used (001) oriented silicon substrates.

SUMMARY OF THE INVENTION

Disclosed is a method of manufacturing of an engineered substrate comprising an APB free III-V compound semiconductor. In some embodiments, the method may include providing a substrate comprising a first semiconductor material having a {001} orientation. An insulating layer may overlay and be in physical contact with the substrate. The insulating layer may include a recessed region that at least partially exposes the substrate. In particular, the recessed region may have a predetermined width at the exposed substrate. The method may further include forming a buffer layer overlaying and in physical contact with the exposed substrate in the recessed region. The buffer layer may have a predetermined thickness and may comprise a group IV semiconductor material. The method may further include applying a thermal treatment at a temperature higher or equal to a roughening temperature of the group IV semiconductor for roughening the surface of the buffer layer. The predetermined width of the recessed region and the predetermined thickness of the buffer layer may be chosen such that the buffer layer, after application of the thermal treatment, takes a rounded shape having a double stepped surface of which the step density multiplied by the step height is greater than equal to 0.05 everywhere on the buffer layer surface. The method may further comprise at least partially filling the recessed region with a III-V compound semiconductor material overlaying and in physical contact with the double stepped surface of the buffer layer.

Also disclosed is an engineered substrate including an ABP-free III-V compound semiconductor grown on a semiconductor substrate. In some embodiments, the engineered substrate may include a substrate made of a semiconductor material having a {001} orientation, and an insulating layer overlaying and in physical contact with the substrate in which and a recessed region is formed, exposing at least partially the substrate. The engineered substrate may further include a buffer layer overlaying and in physical contact with the exposed substrate in the recessed region. The buffer layer may comprise a group IV-semiconductor material and may have a curved shape with a double-stepped surface. The engineered substrate may further include a III-V compound semiconductor material layer at least partially filling the recessed region and overlaying and in physical contact with the double-stepped surface of the buffer layer.

On double-stepped surfaces of group IV semiconductor materials, all the terraces have the same orientation, which makes them highly suitable as a starting surface for growing APB-free III-V compound materials. The inventors have found that double-stepped surface formation in the buffer layer upon thermal treatment can be promoted in a controlled manner locally, by growing the buffer layer having a predetermined thickness and comprising a group IV semiconductor material in a recessed region in the insulating layer of predetermined width, which exposes at least partially the substrate.

According to the invention, the predetermined width of the recessed region and the predetermined thickness of the buffer layer are chosen such that the buffer layer, after the thermal treatment, takes a rounded shape having a double-stepped surface of which the step density multiplied by the step height is greater than or equal to 0.05 everywhere on the buffer layer surface. It has been found that if the step density multiplied by the step height is greater than or equal to 0.05 everywhere on the buffer layer surface, double step formation is energetically favoured. In order to promote the double step formation the temperature of the thermal treatment has to be higher than or equal to the roughening temperature of the buffer layer material. At this temperature, the free energy of step formation becomes zero, such that there is no energy barrier to prevent double step formation.

According to the invention, the buffer layer is grown on the substrate made of a semiconductor material having a {001} orientation. The {001} orientation refers to the family of equivalent planes ((001), (100) etc.) and it is an exact orientation, such as widely used in high-volume silicon manufacturing. No miscut or off-cut of the substrate is required for the method of the invention. This is a very important advantage with respect to the state of the art substrates which make use of slight misorientations to prevent forming APB domains in the III-V grown material. Substrates made of a semiconductor material having a {001} orientation are standard in the CMOS industry and are therefore highly desirable as a substrate for growing III-V compounds.

In embodiments of the invention, the substrate can be made of silicon with an exact {001} orientation and the insulating layer can be silicon oxide. Advantageously, a plurality of recessed regions can be formed in a shallow trench isolation (STI) pattern which typically defines active areas in silicon separated by isolation areas made of silicon oxide. In this way, the recessed regions are defined such that the sidewalls are in silicon oxide, while the bottom is exposing the silicon (001) substrate. In this approach some of the recessed regions on the wafer (substrate) can be filled up with a III-V compound material, as disclosed herein, while other recessed regions on the same wafer can be filled up with crystalline germanium, thereby achieving active areas in two different materials and enabling the heterogeneous integration of, for example, advanced CMOS devices.

BRIEF DESCRIPTION OF THE DRAWINGS

All drawings are intended to illustrate some aspects and embodiments of the present invention. The drawings described are only schematic and are non-limiting.

DETAILED DESCRIPTION OF ILLUSTRATIVE EMBODIMENTS

Figure 1:
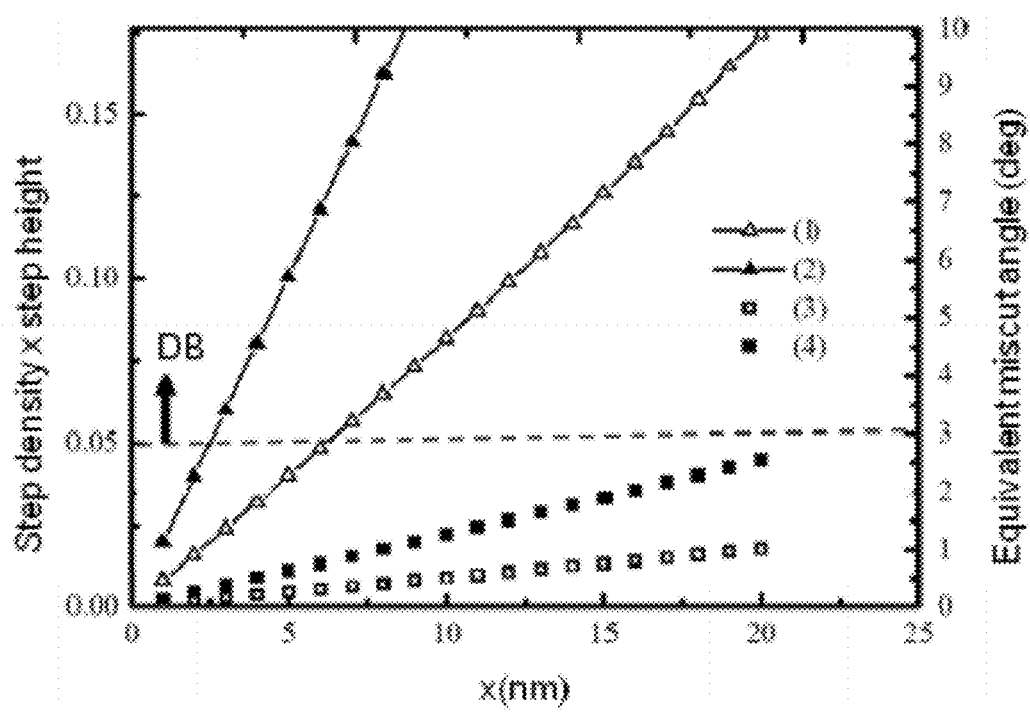
FIG. 1 represents the product of the Step Density and the Step Height (step density×step height, shown on the left) and the Equivalent Miscut Angle (shown on the right) as a function of the distance, x, from the center of the trench for different combinations of trench width (w) and buffer layer thickness (h): (1) w=100 nm, h=20 nm; (2) w=100 nm, h=50 nm; (3) w=300 nm, h=20 nm; (4) w=300 nm, h=50 nm. The horizontal dashed line at 0.05 indicates the lowest border of the double-stepped surfaces domain (DB).

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

There are several ways to tackle lattice mismatch issues. One of the common methods is to use high aspect ratio structures in which, if the aspect ration is sufficiently high, the defects may be trapped at the bottom of the trench. However, this method is still inadequate to completely remove the defects originated from the large mismatch.

Another method is to use a lateral growth technique, which involves restricting the defects originated from the bottom of a small trench and then growing defect-free III-V compound material in a lateral manner, which avoids the mismatch issue. However, this method results in an area on top of the trench in which devices cannot be formed, as the area is not defect-free. In addition, lateral growth technique is generally applied only to silicon (111) wafers since direct growth of III-V compound on silicon (001) is rather difficult.

One approach to integrate III-V compound materials on silicon substrates is selective epitaxial growth in structures with a shallow trench isolation (STI) pattern. Due to the aspect ratio trapping effect (also known as the necking effect) in submicron trenches, some of the defects may be trapped and annihilated.

Selective epitaxial growth makes it possible to fabricate germanium channel pMOS devices in the vicinity of III-V channel nMOS devices so that high performance CMOS devices can be fabricated on a single silicon substrate. In addition, the integration of optoelectronic devices on a silicon chip will also likely need selective epitaxial growth of III-V materials on the dedicated silicon areas.

As noted above, miscut substrates (wafers) were introduced to avoid the formation of APBs in epitaxially grown III-V compound materials on un-patterned (blanket) substrates. A miscut or an off-cut substrate is a substrate having a surface crystal orientation which is deliberately miscut a few degrees off the main axis. The inclination is called miscut angle and the surface of such a miscut substrate is known as vicinal crystal surface. A vicinal crystal surface is thus one that is slightly misoriented with respect to a low-index direction, and typically includes terraces of the low index direction and steps that accommodate the misorientation.

The miscut silicon wafers are not standard for high-volume wafer manufacturing, and they introduce additional problems to the growth of the III-V compound materials. For example, during the epitaxial growth of the III-V compound materials on patterned miscut silicon wafers, a preferential growth with respect to the pattern orientation (e.g., trench direction) is developed. This non-isotropic behavior creates undesirable macrostep defects which affect further the performance of the devices.

The surface misorientation of a vicinal surface can be accommodated by single layer (SL) and double layer (DL) steps, leading to surfaces that are not only different in the height of the steps and the width of the terraces, but also in their basic lattice structure. However, typically the terrace width of each type of steps remains constant over the whole miscut substrate.

The single-stepped surface of vicinal silicon (100) has a two-sublattice structure with terraces of both 2×1 and 1×2 periodicity, which makes it unsuitable as a starting surface for growing APB-free III-V compound materials. On the other hand, on the double-stepped surface all the terraces have the same orientation which makes it highly suitable as starting surface for growing APB-free III-V compound materials. The terraces of a vicinal surface having only double layer steps would have the same width and height over the whole substrate. There are two types of single layer steps (SA and SB) and two types of double layers steps (DA and DB). Transitions from single layer steps to double layers steps (more specifically DB) are possible under certain annealing.

It has been found by the inventors that surface double steps (DB) formation can be promoted in a controlled manner locally, such as in a recessed region of a patterned substrate having a {001} exact orientation, by growing first a thin buffer layer comprising a group IV semiconductor material, such as germanium, followed by a high temperature treatment. Upon applying the thermal treatment, the thin buffer layer in the recessed region takes a curved (concave) shape as a result of surface energy minimization. The curved surface has a high density of surface steps, and, depending on the local surface curvature, single steps, single-double mixed steps, and double steps occur.

It has been further found by the inventors that double steps formation is energetically favored when the product between the step density and step height at any point of the rounded surface is greater than or equal to 0.05. This value of the step density×step height corresponds to a surface inclination/misorientation of about 3 degree. Throughout the description, this local inclination is also referred to as the equivalent miscut angle.

The step density may be defined as the number of steps per unit length. Upon the thermal treatment, double steps are formed over the whole curved surface. The double steps at the center of the trench will have a different terrace width than the double steps in the vicinity of the trench walls. The step height of a double step equals the half of the lattice constant (a/2) for materials with diamond structure, including silicon and germanium. This is valid also for the alloys of group IV semiconductor materials.

In particular, the step height of the double-stepped surface for germanium is about 0.283 nm (as the lattice constant of germanium is about 0.566 nm), while the step height of the double-stepped surface for silicon is 0.271 nm (as the lattice constant of silicon is about 0.543 nm). Given the fact that the step height of the double-stepped surfaces is a constant for a given material, the constraint above regarding forming the double-stepped surfaces can be translated for a given material to a step density constraint. For example, for gemanium a step density of about 1/(5 nm) or 0.2 nm$^{-1}$ is required to form the double stepped surfaces. This can be similarly applied for other materials as well.

In other words, for germanium, the single steps are thermodynamically unstable and can be converted into double steps if the terrace width at the trench center is smaller or equal to 5 nm. Lower values of the terrace width, such as values between 2 and 5 nm can be beneficial as starting surface for III-V compound material growth. Variations are possible depending on the III-V compound material to be grown and an optimal value can be determined without undue burden by the person of ordinary skill in the art.

The buffer layer curvature can be controlled by modifying the buffer layer thickness and/or the trench (recess) width.

As shown in FIG. 1, for a given buffer layer thickness, e.g. 20 nm, only the 100 nm (curve 1) trench falls into the double step region (DB) at the (proximity of the) trench center (that is, for x lower than about 5 nm). The double step region in FIG. 1 is the domain above the horizontal dotted line, corresponding to equivalent misorientations of at least 3 degrees and a (step density×step height) value of 0.05 or higher.

For a thicker buffer layer (e.g., 50 nm) grown in a 100 nm wide trench (curve 2) a distance very close to the trench center (x about 3 nm) falls in the double step region.

As shown in FIG. 1, wider trenches (curves 3 and 4, w=300 nm) leave the proximity of the trench center in the single step region, meaning that there is a higher risk for APB formation during III-V growth in these wide trenches. A thicker layer should be used to promote the double step formation in these wide trenches.

In an embodiment, the buffer layer with a double-stepped surface can be formed by epitaxially growing the buffer layer comprising the group IV semiconductor material on the exposed substrate and, thereafter, applying the thermal treatment to form the double-stepped surface of the buffer layer.

The temperature of the thermal treatment may be greater than or equal to a roughening temperature of the group IV semiconductor material of which the buffer layer is made. For example, in the case of germanium, the temperature may be higher than 600° C., higher than 650° C., or even higher than 700° C. The upper limit in the case of germanium is about 800° C. When choosing the anneal temperature, a certain variation of the roughening temperature with the layer thickness has to be taken into consideration, since the roughening temperature might slightly increase with the decreasing layer thickness.

A surface becomes rough (that is, undergoes a roughening transition) at the temperature at which steps form spontaneously. At this temperature, called herein the roughening temperature, the free energy of step formation becomes zero.

Figure 2:
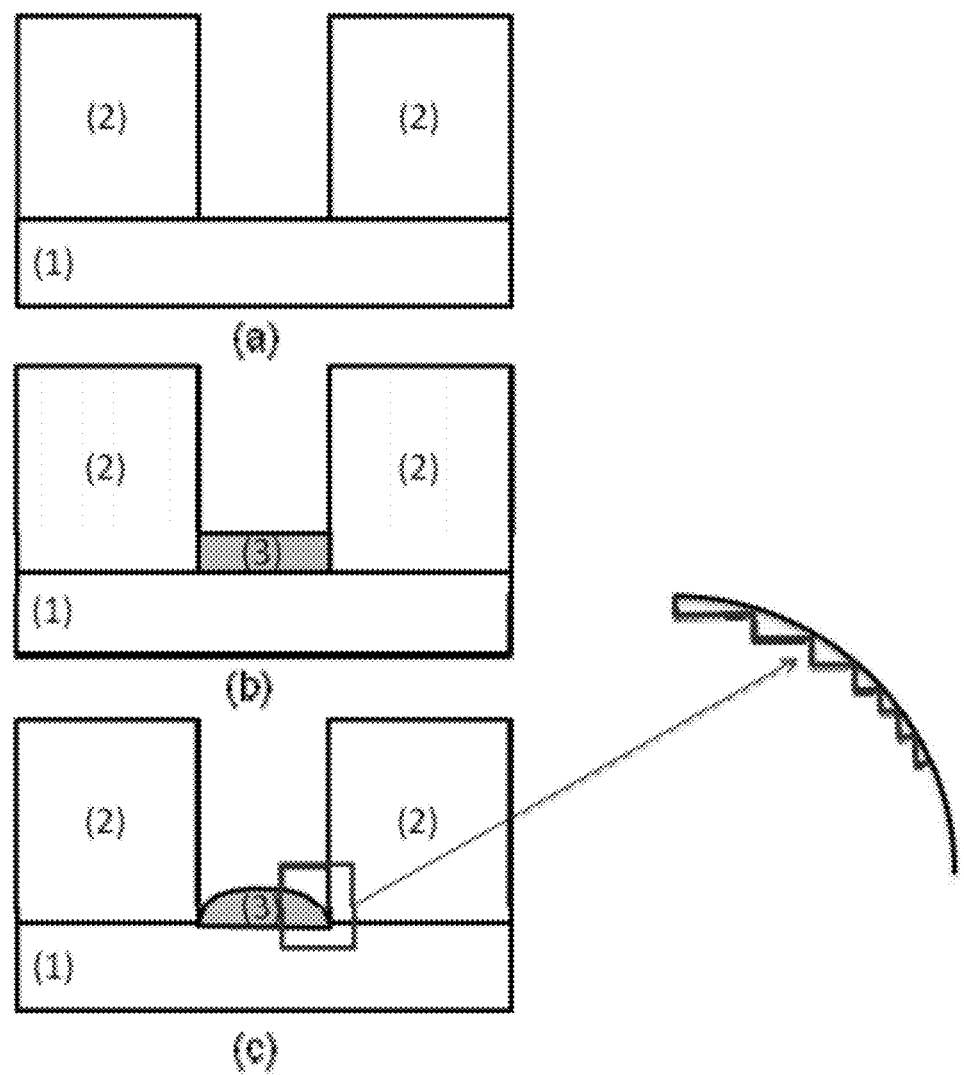
FIG. 2 represents schematically a method, according to one embodiment, comprising: (a) trench formation in insulating material (2) exposing semiconductor substrate (1) with (001) or equivalent orientation; (b) epitaxial growth of a buffer layer (3) made of a group IV semiconductor material; (c) thermal treatment to form the double-stepped surface of the group IV semiconductor material, as shown in the inset.

In one embodiment, the method may further include choosing a thickness of the buffer layer and a width of the recessed region such that, upon applying the thermal treatment, the buffer layer takes a concave shape having a double-stepped surface with a (step density×step height) greater than or equal to 0.05 on the surface, such as in the center of the trench and the proximity thereof. This minimum value corresponds to a local surface inclination of about 3 degree. This embodiment is illustrated schematically in FIG. 2 (a)-(c).

As used herein, "concave" can be understood to mean having a shape that can be represented by a function that has a decreasing slope. "Decreasing" here means "non-increasing", rather than "strictly decreasing", and thus allows zero slopes.

Figure 3:
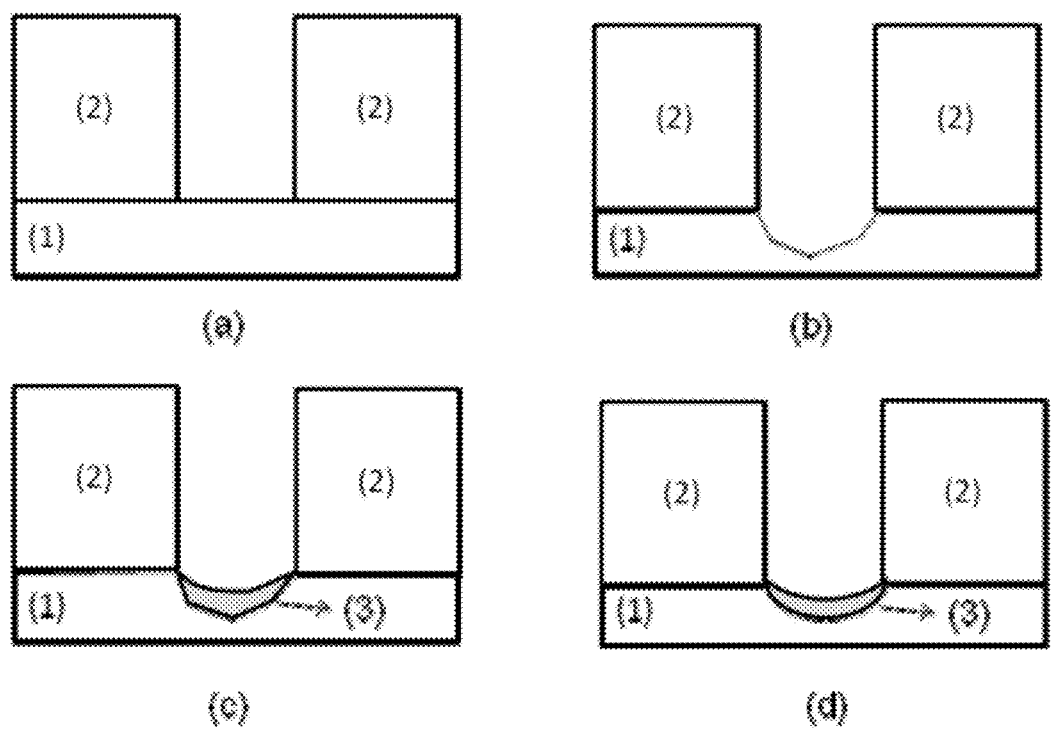
FIG. 3 represents schematically a method, according to another embodiment, comprising: (a) trench formation in insulating material (2) exposing semiconductor substrate (1) with (001) or equivalent orientation; (b) isotropic etch of the substrate exposed in the trenches; (c) epitaxial growth of a buffer layer (3) made of a group IV semiconductor material; (d) thermal treatment to form the double stepped surface of the a group IV semiconductor material.

In another embodiment, the method comprises: performing an isotropic etch of the exposed substrate in the recessed region, prior to forming the buffer layer, such that the exposed substrate takes a rounded shape. Thereupon a buffer layer is formed (grown) having also a rounded shape. Upon applying the thermal treatment, a double-stepped surface is formed having a (step density×step height) value greater than or equal to 0.05 on the surface, such as in the center of the trench and the proximity thereof. This embodiment is illustrated schematically in FIG. 3 (a)-(d).

In embodiments of the invention, the isotropic etch can be performed by a wet etch process. In embodiments wherein the substrate is made of silicon, a KOH etch solution can be used to etch isotropic the substrate. Alternatively, in other embodiments of the invention, the isotropic etch can be vapor-etch, such a dry-gas vapor HCl in case of silicon, or a reactive ion etch with a chemistry suitable to etch isotropic the substrate.

In some embodiments, an additional thermal treatment can be performed after the isotropic etch of the substrate and prior to forming the buffer layer. For example, this additional thermal treatment can be applied in-situ in the epi reactor where the group IV buffer layer is grown, thereby removing any native oxide and/or contaminants present on the substrate surface.

Figure 4:
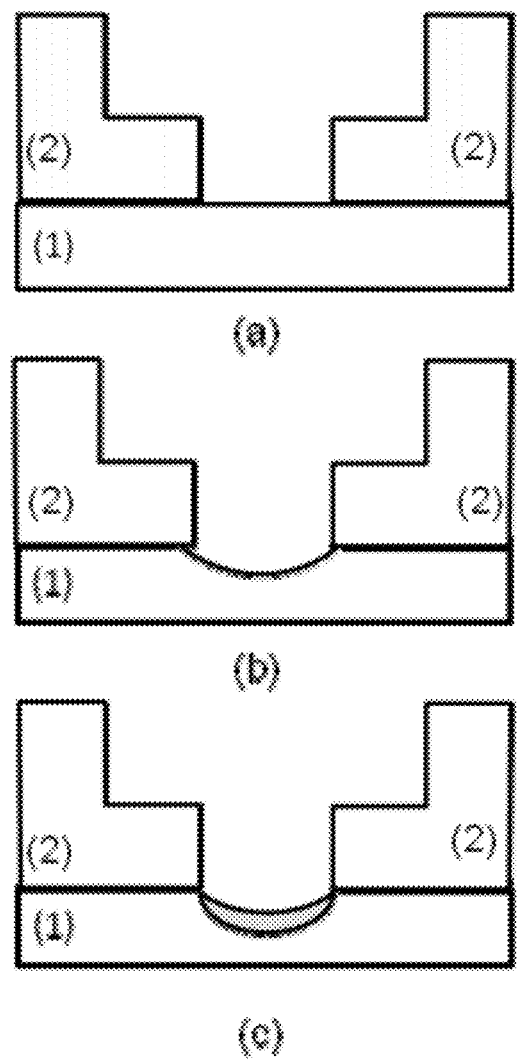
FIG. 4 represents schematically a method, according to yet another embodiment, comprising: (a) dual damascene structure formation in insulating material (2) exposing semiconductor substrate (1) with (001) or equivalent orientation; (b) isotropic etch of the substrate exposed at the bottom of the dual damascene structure; (c) epitaxial growth of a buffer layer (3) made of a group IV semiconductor material; (c) thermal treatment to form the double stepped surface of the a group IV semiconductor material.

In some embodiments, the recessed region can have a dual damascene profile. A dual damascene profile is schematically represented in FIG. 4 (a) and is known in the art as a profile of a recessed region comprising a via or a hole exposing the substrate at the bottom and thereupon a trench. The trench may be wider than the via underneath. Growing the III-V compound semiconductor material in a dual damascene recessed profile has the additional benefit of forming a large area of high quality (APB-free) III-V compound semiconductor material both in the center of the recessed region (above the vias) and in the lateral trench that can be used as active area for III-V-based devices.

In some embodiments, the first semiconductor material is a group IV semiconductor such as silicon or germanium or combinations (alloys) thereof. Further, in embodiments the substrate can be made of silicon with an exact {001} orientation. Still further, in some embodiments the insulating layer can be silicon oxide. Advantageously, the recessed region may be formed in a shallow trench isolation (STI) pattern which typically defines active areas in silicon separated by isolation areas made of silicon oxide.

The recessed regions may be defined such that the sidewalls are in silicon oxide, while the bottom is exposing the silicon (001) substrate. In this approach some of the recessed regions on the wafer (substrate) can be filled up with a III-V compound material according to the method, while other recessed regions on the same wafer can be filled up with crystalline germanium, thereby achieving active areas in two different materials and enabling in this way the heterogeneous integration of, for example, advanced CMOS devices.

In some embodiments, the group IV semiconductor material of the buffer layer can be germanium.

In some embodiments, both the group-IV semiconductor material of the buffer layer and the III-V compound semiconductor material can be grown epitaxially, in, for example, a low-pressure chemical vapor deposition (LPCVD) or metalorganic vapor phase epitaxy (MOVPE) reactor, or a molecular beam epitaxy (MBE) chamber.

The steps of epitaxially growing the buffer layer, applying a thermal treatment to form the double stepped surface and at least partially filling the recessed region with a III-V compound semiconductor material can be performed either in separate chambers on different tools, or without vacuum break, in the same process chamber/reactor or in different chambers on the same cluster tool.

Furthermore, in embodiments in which a vapor-etch is employed to etch isotropic the substrate prior to growing the buffer layer, the vapor-etch can be advantageously performed in the same chamber/reactor wherein the buffer layer is epitaxially grown.

In embodiments in which the buffer layer is made of germanium, the thermal treatment can be performed in, for example, H2- and As-comprising atmosphere at a temperature above the roughening temperature, such as between 600° C. and 800° C. The thermal treatment can be performed in-situ in an MOVPE reactor prior to the III-V compound growth. Pre-treating the buffer layer in an atmosphere comprising an As-precursor (such as a tertiary-butal-arsine (TBA) or arsine (AsH3) precursor) forms a group V terminated surface beneficial for the III-V compound growth. In addition to the double step formation, the thermal treatment AN in H2/As-containing atmosphere removes any native germanium oxide present on the surface and forms a group V terminated surface ready to be used for the epitaxial growth of the III-V compound materials.

In some embodiments, the III-V compound semiconductor grown in the recessed region can be any III-V compound such as III-arsenides, III-phosphides, III-nitrides, III-antimonides, or combinations thereof.

In some embodiments, the III-V compound semiconductor may have a zincblende crystal structure. For instance, the III-V compound semiconductor may be selected from the group consisting of AlAs, AlP, AlSb, BN, BP, GaAs, GaP, GaSb, InAs, InP, InSb, or combinations thereof.

The above-described methods may be used to obtain an engineered semiconductor substrate. The engineered substrate may include a substrate made of a semiconductor material having a {001} orientation, and an insulating layer overlaying and in physical contact with the substrate in which and a recessed region is formed, exposing at least partially the substrate. The engineered substrate may further include a buffer layer overlaying and in physical contact with the exposed substrate in the recessed region. The buffer layer may comprise a group IV-semiconductor material and may have a curved shape with a double-stepped surface. The engineered substrate may further include a III-V compound semiconductor material layer at least partially filling the recessed region and overlaying and in physical contact with the double-stepped surface of the buffer layer.

In some embodiments, both the exposed substrate in the recessed region and the curved buffer layer can have a rounded shape. That is, the substrate may have a rounded surface locally, in the recessed region. As described above, the rounded surface can be formed by isotropic etch of the exposed substrate in the recessed region. Thereupon, on the rounded surface of the substrate, a buffer layer may be epitaxially grown, which may also have a rounded surface. The local slope in the proximity of the trench center of the curved buffer layer should be high enough to achieve, after a thermal treatment, a double-stepped surface with a (step density×step height) value greater than or equal to 0.05. For a given trench width, this can be controlled by adjusting the depth of the isotropic etch in the center of the trench, and the thickness of the buffer layer. The local slope of the rounded shaped substrate may be slightly higher than the local slope of the buffer layer.

In alternative embodiments, the buffer layer can have a concave shape. A thickness of the buffer layer and a width of the recessed region are chosen such that upon applying the thermal treatment a double-stepped surface with a (step density×step height) greater than or equal to 0.05 is obtained.

In some embodiments, a terrace width of the-double stepped surface can be between 2 and 5 nm. Further, in some embodiments, the recessed region may have a width less than 500 nm, or even less than 200 nm.

In embodiments where the recessed region in silicon (001) has a width of about 200 nm and the buffer layer is made of germanium, the buffer layer thickness may be between 10 and 50 nm.

In some embodiments, the recessed region may have a dual damascene profile, as shown in FIG. 4 (a).

To this end, a dual-damascene profile can be patterned starting from a shallow trench isolation initial pattern on a silicon (100) wafer, using standard dual-damascene (via-first or trench first) processing technology. Then, as shown in FIG. 4(b), a rounded silicon recess may be etched (e.g., using chlorine-based reactive etchants with biasing control) at the bottom of the trench. Thereafter, the trench surface damage caused by the dry etch of the silicon substrate can be removed by removing a thin sacrificial oxide.

The dual damascene-STI patterned wafer may be subsequently subjected to a selective epitaxial growth of a germanium buffer layer in the trench, prior to the growth of an III-V compound material (FIG. 4(c)).

In a specific example, first an indium phosphide layer may be grown on top of the germanium buffer layer, before an indium gallium arsenide layer is grown to complete the construction of a defect-free indium gallium arsenide channel on a (001) silicon substrate.

An advantage of the dual damascene structure is that it enables the formation of the defect-free lateral growth zones. When combined with local creation of double-stepped surfaces described above, the defect-free area of the III-V compound obtained is much larger and may include both the center and the lateral growth zones.

One embodiment may involve selective area growth of APB-free idium phosphide layers in submicron trenches on exact (001) oriented silicon substrates using a thin germanium buffer layer.

The APBs may be successfully avoided by the controlled formation of double steps on the germanium buffer layer, as described above. The elimination of APBs due to the double stepped germanium buffer layer combined with the defect necking effect yields a defect-free indium phosphide layer inside the trenches.

The germanium buffer layer may be formed by selective area growth in submicron trenches on (001) exact oriented silicon.

In this specific embodiment, 200 mm silicon (001) substrates are used. Trenches (recessed regions) with a 100 nm and 200 nm width and a trench length of 0.5 µm to 100 µm are defined with a conventional STI patterning scheme in silicon CMOS manufacturing. In this way, about 10% of the total silicon wafer surface was exposed at the bottom of the trenches for the indium phosphide deposition.

In this specific embodiment, the thickness of STI-insulation layer (e.g., silicon oxide) may be about 300 nm. After a standard wet clean and an HF dip, the silicon active areas in between two insulation areas are recessed to a depth of about 400 nm by HCl-vapor phase etching at 850° C. and 10 Torr in an epitaxial reactor, preceded by an in-situ $H_2$ bake at 850° C. for native oxide removal. Subsequently, a thin (about 30 nm) germanium layer was grown at 450° C. and atmospheric pressure, using a germane ($GeH_4$) precursor (1% in $H_2$ carrier gas).

In this specific embodiment, after deposition of the thin germanium buffer layer, the wafers are cleaved into 50×50 mm2 pieces and loaded into an MOVPE reactor. Trimethylindum (TMIn) is used as group-III element precursor. For the group V element, tertiarybutylarsine (TBAs) and tertiarybutylphosphine (TBP) are used.

In this specific embodiment, before performing the epitaxial growth of indium phosphide, a thermal treatment (pre-epi bake) at 740° C. and reduced pressure in presence of TBAs and H2 carrier gas is carried out. This thermal treatment serves to remove the germanium native oxide, achieve the As-terminated surface, and promote double step formation.

In this specific embodiment, following this bake, the temperature is ramped down to 420° C. to grow about 30 nm indium phosphide seed layers. After the growth of the indium phosphide seed layer, the temperature is ramped to 640° C. for the bulk indium phosphide layer growth. The crystalline defects may be characterized with transmission electron microscopy (TEM).

Figure 5:
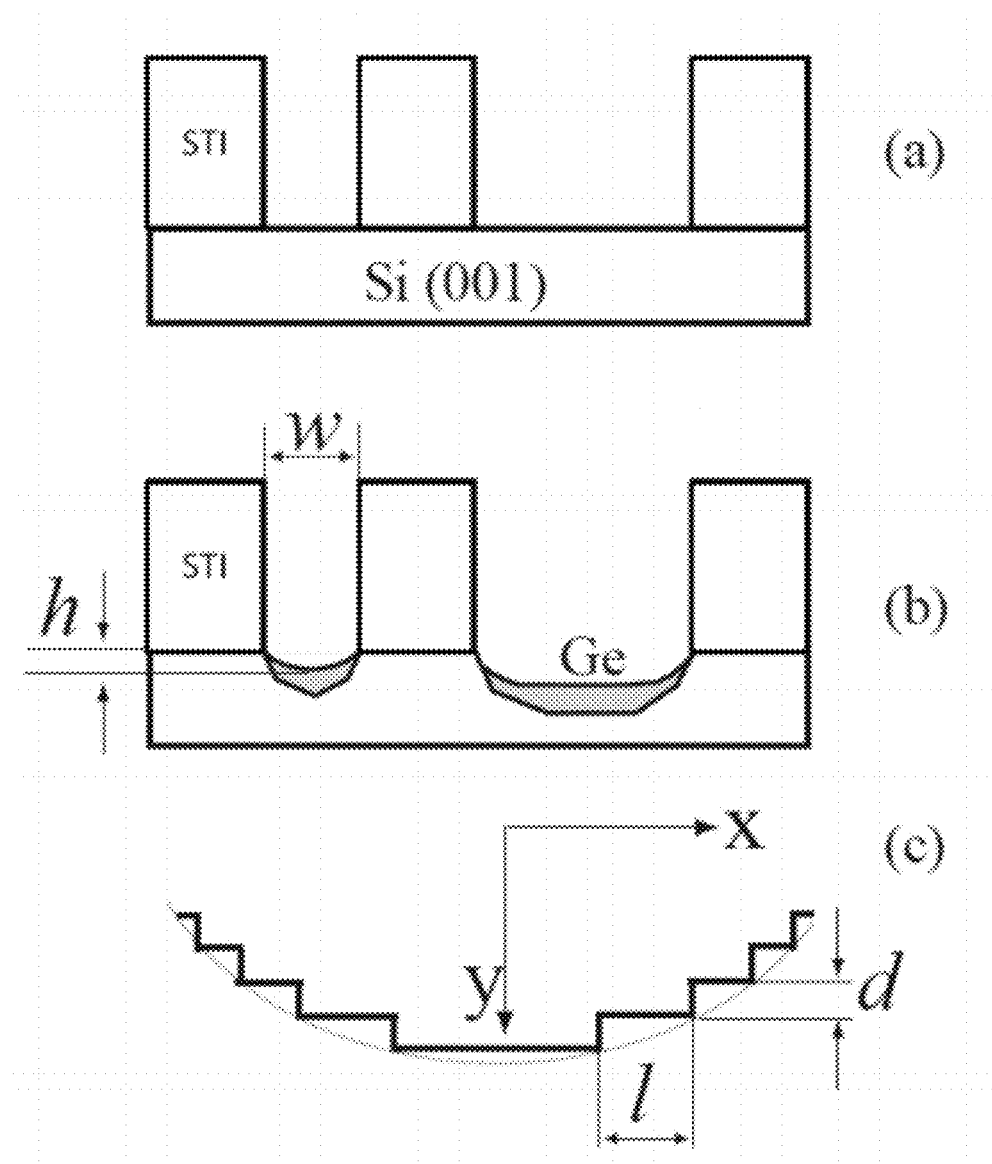
FIG. 5 represents schematically a method, according to still another embodiment: (a) STI trenches are defined on a silicon (001) substrate: narrow (submicron) trench (left) and wide trench (right); (b) exposed silicon substrate is over recessed such that a rounded surface is obtained and thereupon a thin germanium layer is deposited; (c) a zoomed-in view of the atomic steps on the germanium surface at the center of a submicron trench. A difference in step density at the center of the trench (x=0) and in the immediate proximity of the center of the trench can be observed. The parameters associated with the atomic steps are shown, trench width w, atomic step height, d, terrace width, 1, and the maximum distance from the germanium surface to the reference silicon surface, h.

In this specific embodiment, to create atomic steps, a thin germanium buffer layer was chosen since germanium double steps are more stable and can be formed at a much lower temperature compared to, e.g., silicon double steps. The atomic step creation mechanism and the control parameters are schematically shown in FIG. 5.

A rounded surface is obtained by over etching (e.g., isotropically) the silicon substrate exposed at the bottom of the trenches. Silicon facets may form in the silicon recess (FIG. 5b). In micron wide trenches (as shown on the right side of FIG. 5b), the (001) surface remains at the center of the trench, which impedes the formation of atomic steps.

Next, a thin germanium layer is grown on the silicon surface. The germanium epitaxial layer follows the starting silicon surface but obscures the sharp intersection between two adjacent facets as a result of surface energy minimization. To create a double step surface on the germanium buffer layer, a high temperature treatment is used. At about 700° C., above the germanium surface roughening temperature, the step formation energy approaches to zero, facilitating surface step formation.

As a result of the high temperature annealing applied, the germanium surface tends to evolve into a rounded surface comprising double steps. The step density on the rounded germanium surface can be approximated analytically by assuming a given surface profile. In a submicron trench, the surface profile can be considered as an elliptical surface described by the equation (1):

$$\frac{x^2}{\left(\frac{w}{2}\right)^2} + \frac{y^2}{h^2} = 1, \quad (1)$$

Where w is the trench width, and h is the maximum distance from the germanium surface to the reference silicon surface, as shown in FIG. 5c. The surface step density can be obtained from the slope of the surface, as described by equation (2):

$$y' = \left| \frac{8hx}{w^2 \sqrt{1 - \left(\frac{2x}{w}\right)^2}} \right| \quad (2)$$

Equation (2) shows that the surface step density depends on both w and h.

In general, the germanium surface step density at the edge of the trench is much larger than that at the trench center. According to the double step formation energetics on vicinal germanium (001) surfaces, to ensure germanium double step formation at the trench center, a minimum step density is required, which corresponds to minimum value of the product (step density×step height) of 0.05 in the proximity of the trench center (x≈5 nm). This value of the step density is equivalent to the step density on a 3° vicinal surface. For wider trenches, a larger h is needed to create the same step density in the proximity of the trench center.

In general, the critical angle at which the transition between the single- and double-stepped surfaces occurs upon anneal is calculated to be about 2°. Experimental data place lower and upper bounds of 1° and 3.5° degrees to the same angle. Throughout this disclosure, a step density equivalent with a local misalignment (critical angle) of 3° is considered as a safe limit for achieving the growth of high quality (APB-free) III-V compound materials.

Figure 6:
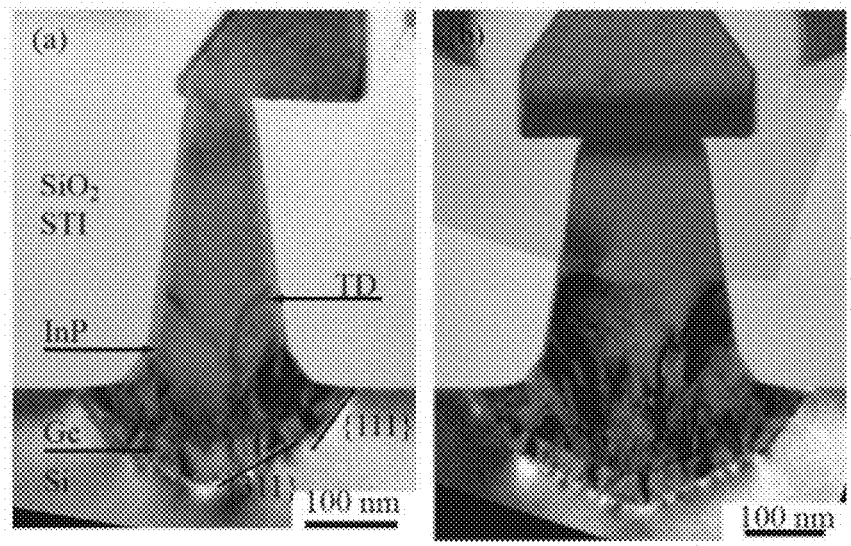
FIG. 6 shows cross-section transmission electron microscopy (TEM) images of indium phosphide layer grown in the 100 nm (shown on the left) and 200 nm (shown on the right) wide STI trenches. {111} and {311} silicon facets were obtained after silicon recess with HCl vapor phase etching. Threading dislocations (TDs) are confined in the bottom of the trenches.

FIG. 6 shows cross-section TEM images of 100 nm and 200 nm wide trenches after indium phosphide growth. Silicon {111} and {311} facets are observed after the silicon recess. The sharp edges of the recessed surface could have caused voids if indium phosphide was directly grown on the faceted silicon surface. The thin germanium buffer layer mitigates the sharp edges and a relatively round surface is obtained. The step density in the proximity of the trench center is significantly larger than 0.05 in both trenches.

The rounded (curved) germanium surface of the germanium buffer layer has several advantages. First, the rounded surface creates initially a high density of single atomic steps. Upon annealing at a temperature above the germanium surface roughening temperature, single surface steps migrate and merge into double B steps. The formation of double B steps on the germanium buffer layer enables the growth of APB-free III-V compound material thereupon.

The rounded germanium surface obscure facets and the subsequent indium phosphide growth follows the germanium surface in a step flow growth mode instead of following different crystal orientation. As a result, no void formation occurs in the III-V compound layer.

Finally, the rounded germanium surface avoids the formation of crystal boundaries associated with the void formation when two crystal facets merge at the center of the trench. In addition, all the threading dislocations (TDs) are confined at the bottom of the trench. With the successful suppression of APB combined with the beneficial defect necking effect leads to defect-free indium phosphide layer at the top of the trenches.

Figure 7:
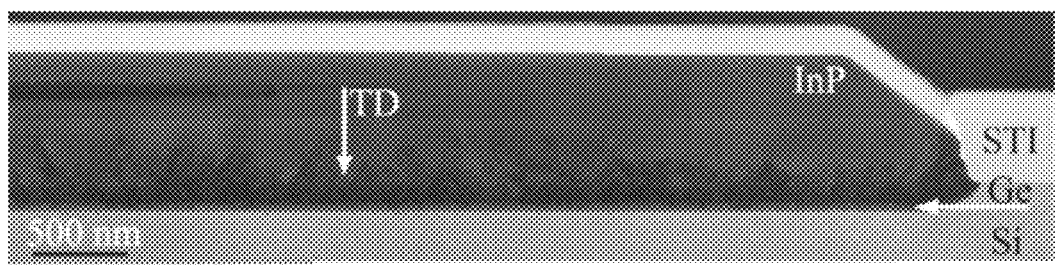
FIG. 7 shows a cross-section TEM image taken along the 200 nm trench shown on the right side of FIG. 6.

TEM analysis along the 200 nm trench was performed to confirm the absence of APB in a larger area. FIG. 7 shows the cross-section TEM image of the same trench as shown on the right side of FIG. 6. No APBs are observed in this long trench. A flat and uniform indium phosphide layer grown on the double stepped germanium buffer layer along the complete length of the trench is obtained.

As shown in Eq. (2), if the local germanium thickness changes, the corresponding atomic step density will vary. The germanium layer grown selectively in the trenches has a uniform thickness which leads to a uniform germanium surface profile and surface atomic step density. The surface step density is determined by both the trench width and the maximum distance between the germanium surface and silicon reference surface. The latter can be controlled by the etch depth in the middle of the trench and the buffer layer thickness. This provides a method to control the step density on the buffer layer and thereby the quality of the III-V compound material which is grown thereupon.

The resulting defect-free selective area grown indium phosphide layers enable the III-V channel device fabrication on standard silicon (001) substrates.

The invention claimed is:

1. A method of manufacturing a III-V compound semiconductor material, comprising:
    providing a substrate comprising:
        a first semiconductor material having a {001} orientation; and
        an insulating layer overlaying and in physical contact with the first semiconductor material, wherein the insulating layer comprises a recessed region exposing an exposed region of the first semiconductor material;
    forming a buffer layer overlaying and in physical contact with the exposed region, wherein the buffer layer comprises a group IV semiconductor material having a roughening temperature;
    thermally annealing the substrate and the buffer layer at a temperature greater than or equal to the roughening temperature, thereby roughening the buffer layer to create a rounded, double-stepped surface of the buffer layer having a step density and a step height, wherein a product of the step density and the step height is greater than or equal to 0.05 on the surface of the buffer layer; and
    at least partially filling the recessed region with a III-V compound semiconductor material overlaying and in physical contact with the surface of the buffer layer.

2. The method of claim 1, wherein forming the buffer layer comprises epitaxially growing the buffer layer.

3. The method of claim 1, wherein the surface of the buffer layer comprises a concave surface.

4. The method of claim 1, further comprising:
    prior to forming the buffer layer, performing an isotropic etch of the exposed region to create a concave surface of the exposed region.

5. The method of claim 4, further comprising:
    after the isotropic etch and prior to forming the buffer layer, thermally annealing the substrate.

6. The method of claim 1, wherein the recessed region has a dual damascene profile.

7. The method of claim 1, wherein the recessed region is formed with a shallow trench isolation pattern.

8. The method of claim 1, wherein:
    the exposed region has a predetermined width;
    the buffer layer has a predetermined thickness; and a curvature of the rounded, double-stepped surface is based at least in part on the predetermined width and the predetermined thickness.

9. The method of claim 1, wherein the group IV semiconductor material comprises germanium, and wherein thermally annealing the substrate and the buffer layer comprises thermally annealing the substrate and the buffer layer in an atmosphere comprising $H_2$ and As at a temperature between 600° C. and 800° C.

10. A method, comprising:
providing a substrate comprising:
  silicon having a {001} orientation; and
  a silicon oxide layer overlaying and in physical contact with the first semiconductor material, wherein the silicon oxide layer comprises a number of recessed regions respectively exposing a number of exposed regions of silicon;
forming a buffer layer overlaying and in physical contact with the exposed regions, wherein the buffer layer comprises a group IV semiconductor material having a roughening temperature;
thermally annealing the substrate and the buffer layer at a temperature greater than or equal to the roughening temperature, thereby roughening the buffer layer to create a rounded, double-stepped surface of the buffer layer having a step density and a step height, wherein a product of the step density and the step height is greater than or equal to 0.05 on the surface of the buffer layer;
at least partially filling at least one of the recessed regions with a III-V compound semiconductor material overlaying and in physical contact with the surface of the buffer layer; and
at least partially filling at least one of the recessed regions with crystalline germanium.

11. An engineered substrate, comprising:
a first semiconductor material having a {001} orientation;
an insulating layer overlaying and in physical contact with the first semiconductor material, wherein the insulating layer comprises a recessed region exposing an exposed region of the first semiconductor material;
a thermally annealed buffer layer overlaying and in physical contact with the exposed region, wherein the buffer layer comprises a group IV semiconductor material having a roughening temperature, wherein the buffer layer has a rounded, double-stepped surface having a step density and a step height, wherein a product of the step density and the step height is greater than or equal to .05 on the surface of the buffer layer; and
a III-V compound semiconductor material at least partially filling the recessed region and overlaying and in physical contact with the surface of the buffer layer.

12. The engineered substrate of claim 11, wherein each of a surface of the exposed region and the surface of the buffer layer comprise concave surfaces.

13. The engineered substrate of claim 11, wherein a terrace width of the surface of the buffer layer is between 2 nm and 5 nm.

14. The engineered substrate of claim 11, wherein:
the exposed region has a predetermined width;
the buffer layer has a predetermined thickness; and
a curvature of the rounded, double-stepped surface is based at least in part on the predetermined width and the predetermined thickness.

15. The engineered substrate of claim 11, wherein the predetermined width is less than 500 nm.

16. The engineered substrate of claim 11, wherein the III-V compound semiconductor material has a zincblende structure.

17. The engineered substrate of claim 11, wherein the III-V compound semiconductor material comprises at least one of indium phosphide and indium gallium arsenide.

18. The engineered substrate of claim 11, wherein the group IV semiconductor material comprises germanium.

19. The engineered substrate of claim 11, wherein the recessed region has a dual damascene profile.

* * * * *